(12) United States Patent
Lockyear et al.

(10) Patent No.: US 7,107,553 B2
(45) Date of Patent: Sep. 12, 2006

(54) METHOD AND APPARATUS FOR SOLVING CONSTRAINTS

(75) Inventors: Brian Eugene Lockyear, Portland, OR (US); James Herbert Kukula, Hillsboro, OR (US); Robert F. Damiano, Lake Oswego, OR (US); Carl Preston Pixley, Beaverton, OR (US)

(73) Assignee: Synopsys, Inc., Mountain View, CA (US)

( * ) Notice: Subject to any disclaimer, the term of this patent is extended or adjusted under 35 U.S.C. 154(b) by 232 days.

(21) Appl. No.: 10/642,885

(22) Filed: Aug. 18, 2003

(65) Prior Publication Data

US 2005/0044512 A1    Feb. 24, 2005

(51) Int. Cl.
*G06F 17/50* (2006.01)
(52) U.S. Cl. .................... 716/4; 716/2; 716/3; 716/5
(58) Field of Classification Search ............ 716/1, 716/3–5, 16, 2; 703/2, 14, 15
See application file for complete search history.

(56) References Cited

U.S. PATENT DOCUMENTS

| | | | | |
|---|---|---|---|---|
| 5,999,714 A | * | 12/1999 | Conn et al. ..................... | 716/2 |
| 6,131,078 A | * | 10/2000 | Plaisted .......................... | 703/2 |
| 6,389,374 B1 | * | 5/2002 | Jain et al. ........................ | 703/2 |
| 6,816,825 B1 | * | 11/2004 | Ashar et al. .................... | 703/14 |
| 7,020,861 B1 | * | 3/2006 | Alpert et al. ................... | 716/6 |
| 2003/0084411 A1 | * | 5/2003 | Moskewicz et al. ............ | 716/3 |
| 2004/0210860 A1 | * | 10/2004 | Ganai et al. .................... | 716/5 |
| 2004/0243964 A1 | * | 12/2004 | McElvain et al. ............. | 716/12 |

OTHER PUBLICATIONS

Davis et al., "A computing procedure for quantification theory", Jul. 1960, Journal of the ACM (JACM), vol. 7 Issue 3.*
Ratschan et al., "Convergent approximate solving of first-order contraints by approximate quantifiers", Apr. 2004, ACM Transactions on Computational Logic (TOCL), vol. 5 Issue 2.*
Jain et al. "Hierarchical constraint solving in the parametric form with applications to efficient symbolic simulation based verification", Oct. 3-6, 1993, Proceedings, 1993 IEEE International Conference on, pp. 304-307□□.*
Guanghui et al., "Design error diagnosis based on verification techniques [logic IC design]", Nov. 16-19, 2003, Test Symposium, ATS 12th Asian, pp. 474-477.*

* cited by examiner

*Primary Examiner*—A. M. Thompson
*Assistant Examiner*—Helen Rossoshek
(74) *Attorney, Agent, or Firm*—Jonathan T. Kaplan (57) ABSTRACT

A decomposition technique, for solving combinational constraint expressions, is presented. Decomposing a set of constraints can increase the opportunities for dividing them into independent sets that do not need to be conjoined in a constraint-solving process using a BDD representation. An AND decomposition, relying on a Theorem 1, is presented. An OR decomposition, relying on a corollary of Theorem 1, is presented. Theorem 1 provides an operation to test for, and create, a pair of sub-constraints G and H which are independent in any two variables $x_0$ and $x_1$. A decomposition procedure is presented for separating as many variables as possible, of an input constraint, into disjoint sub-constraints. A merging procedure is presented, that can be used if a decomposition does not only contain constraints whose support sets are disjoint from each other. The decomposition procedure can also be used to identify hold constraints.

13 Claims, 6 Drawing Sheets

METHOD AND APPARATUS FOR SOLVING CONSTRAINTS

CROSS REFERENCE TO RELATED APPLICATIONS

This application is related to the following U.S. patent application, herein incorporated by reference, and referred to herein as the '0504 Application:

"Method and Apparatus For Solving Constraints," filed with Express Mail No. EU600-802-975US on the same date as the present application, with inventor James Herbert Kukula, and having U.S. patent application Ser. No. 10/643,050.

FIELD OF THE INVENTION

The present invention relates generally to the solution of sets of constraints, and more particularly to the solution of sets of constraints in connection with the generation of random test data.

BACKGROUND OF THE INVENTION

Random test data has a wide variety of uses. A particularly important application of random test data is in the verification of digital electronic circuits in order to exercise a wide variety of circuit paths for possible faults.

To tackle the increasing complexity of integrated digital electronic circuits, designers need faster and more accurate methods for verifying the functionality and timing of such circuits, particularly in light of the need for ever-shrinking product development times.

The complexity of designing such circuits is often handled by expressing the design in a high-level hardware description language (HLHDL). The HLHDL description is then converted into a physical circuit specification through processes, well known to those of ordinary skill in the art as "synthesis," involving translation and optimization. Examples of an HLHDL are:

1. IEEE Standard 1364-2001, for the Verilog Hardware Description Language. The Institute of Electrical and Electronics Engineers, Inc., 345 East 47$^{th}$ Street, New York, N.Y. 10017-2394, USA.
2. IEEE Standard 1076-1993, for the VHDL Hardware Description Language. ISBN: 1559373768, August 1994. The Institute of Electrical and Electronics Engineers, Inc., 345 East 47$^{th}$ Street, New York, N.Y. 10017-2394, USA.

An HLHDL description can be verified by simulating the HLHDL description itself, without translating the HLHDL to a lower-level implementation. This simulation is subjected to certain test data and the simulation's responses are recorded or analyzed.

Verification of the HLHDL description is important since detecting a circuit problem early prevents the expenditure of valuable designer time on achieving an efficient circuit implementation for a design which, at a higher level, will not achieve its intended purpose. In addition, simulation of the design under verification (DUV) can be accomplished much more quickly in an HLHDL than after the DUV has been translated into a lower-level, more circuit-oriented (e.g., gate-level) implementation.

The verification of HLHDL descriptions has been aided through the development of Hardware Verification Languages (or HVLs). An HVL can be implemented and supported by a test-bench automation (TBA) tool. Among other goals, HVLs are intended to provide programming constructs and capabilities which are more closely matched to the task of modeling the environment of an HLHDL design than are, for example, the HLHDL itself or software-oriented programming languages (such as C or C++). HVLs permit a DUV, particularly those DUVs expressed in an HLHDL, to be tested by stimulating certain inputs of the DUV and monitoring the resulting states of the DUV.

Most HVLs include a programming mechanism by which to specify constraints on a set of variables. Constraints have the advantage of permitting "legal" sets of inputs to a DUV (i.e., inputs to the DUV that simulate the DUV's environmental restrictions) to be specified in a declarative programming manner that is often easier to specify than, for example, a procedural approach. Such randomly selected solutions to these constraints can be used to provide stimulus to the DUV. Consequently, there is a need for an efficient constraints solving system for use with TBA tools.

Figure 1A:
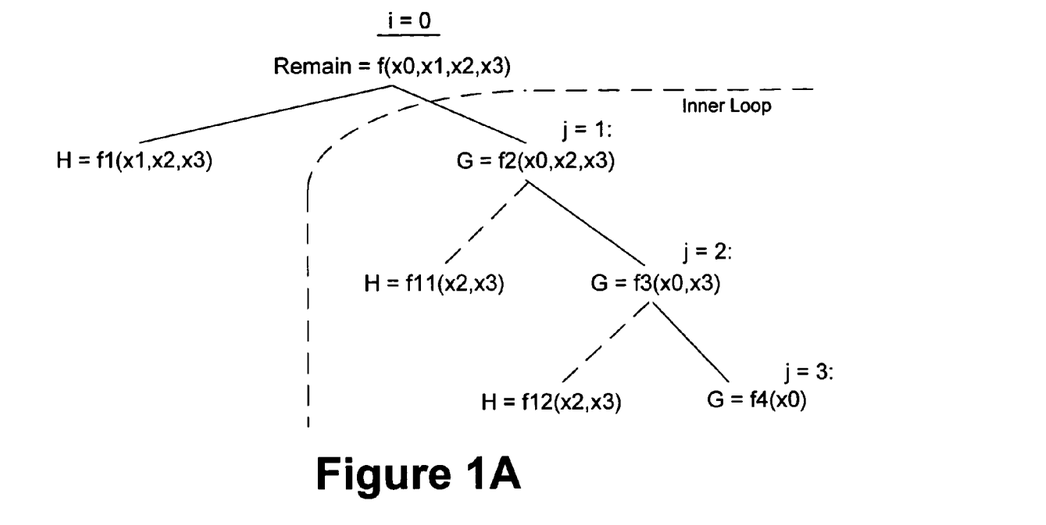
FIGS. 1A–1D depict a step-by-step simulation of constraint decomposition procedure operating upon an example function.
Figure 1B:
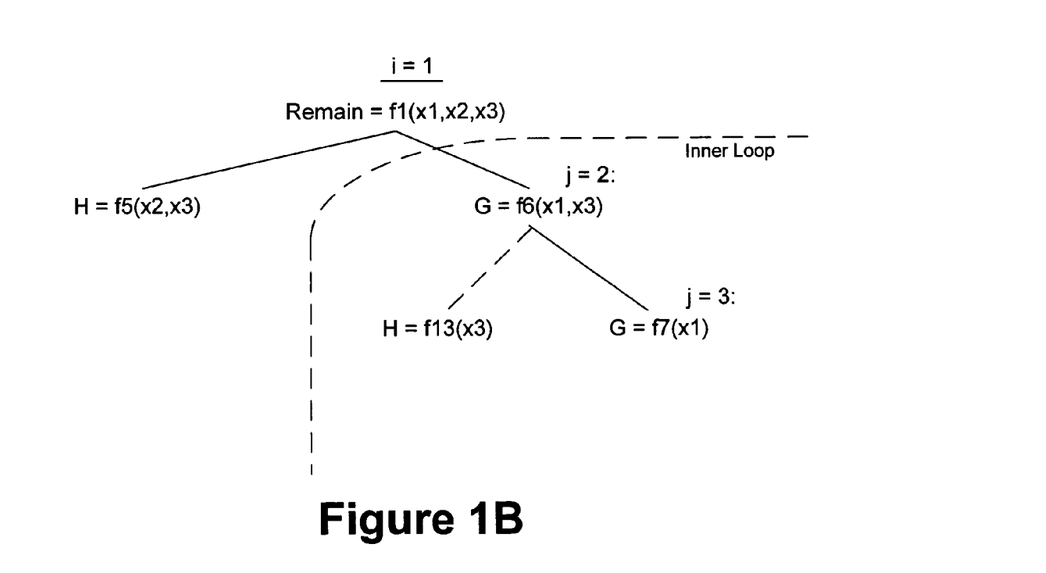
Figure 1C:
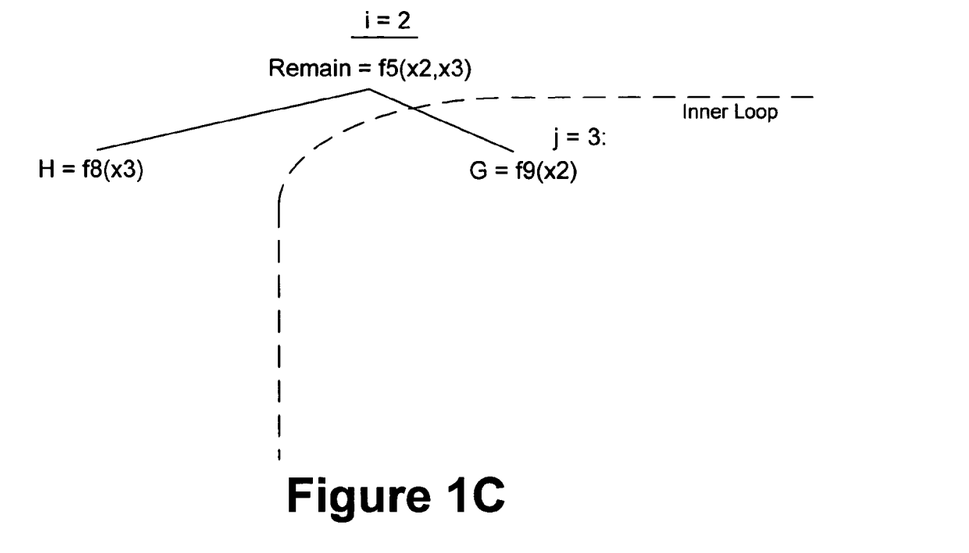
Figure 1D:
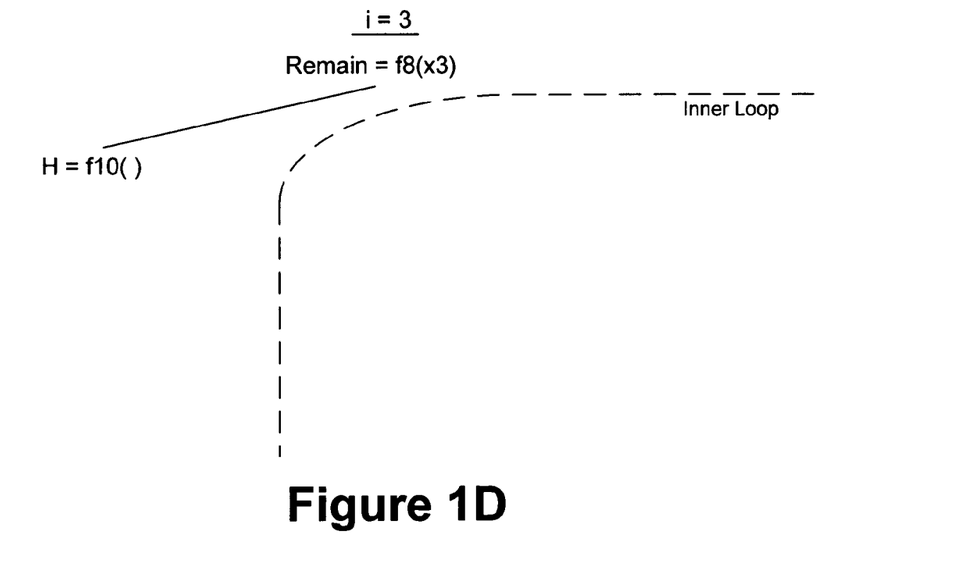
Figure 2:
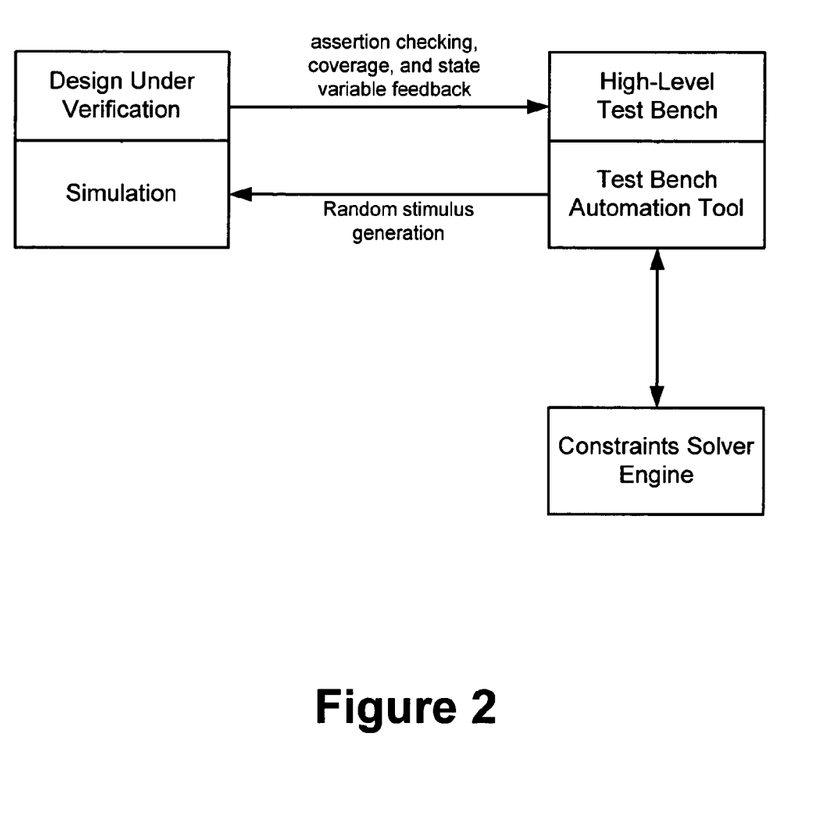
FIG. 2 depicts a high-level view of a commonly used functional verification methodology.

A high-level view of this commonly used functional verification methodology is depicted in FIG. 2.

The high-level test bench is written in an HVL, that is supported by the underlying TBA tool, and has two main goals. First, the test bench seeks to apply random stimulus and/or directed tests to the DUV by interfacing to a simulator. Second, the test bench seeks to analyze results from the simulation by performing assertion checking and by measuring the functional coverage. Most designs have assumptions on how they interact with their environment. A goal of the test-bench is to generate random stimuli to the DUV that satisfy these environmental restrictions. Consequently, most commercial and industry-standard HVLs provide means to specify constraints on certain variables (that are declared within the test-bench) and the ability to randomize a certain set of these variables upon demand. The constraints themselves could be arbitrary expressions on signed or unsigned variables with varying bit-widths using the high-level operators supported by the HVL. The results of the randomization specified by the test-bench are translated (through procedural code within the test-bench) by the TBA tool into legal random stimuli to the DUV.

When control is handed over to the simulator of the DUV, the effect of the newly-generated stimulus from the TBA tool is simulated until there are no more events for the simulator in the current clock cycle. At this point, control is handed back to the test-bench, which does assertion checking for the truth of certain properties (based on the current signal values of the DUV) and measures functional coverage (as defined by test-bench criteria). In addition, the test bench can receive feedback from the DUV, in the form of state variables (sv's), that it uses to adaptively adjust the course of its test generation. The constraints in the test-bench could also contain test-bench state variables (sv's). The test-bench, through the TBA tool, then generates the next set of random stimuli to the DUV, by finding a solution to the random variables of its constraints, given the current values for the sv's, and the process continues, until the test-bench finishes.

While constraints provide a powerful specification language, for such applications as design verification, finding an assignment to their variables that satisfies them can be complex. It is therefore desirable to have improved methods for finding solutions to a constraint or a set of constraints.

SUMMARY OF THE INVENTION

The present invention comprises techniques for solving combinational constraint expressions.

A constraint is any expression that evaluates to a Boolean value (i.e., either TRUE or FALSE). In this context, an expression is any legal sequence of variables and operators, as defined in the language used to express the constraints.

A constraint variable can be a random variable (rv) or a state variable (sv). The constraint solving problem comprises finding legal assignments to all random variables in V, given the particular values currently assigned to the state variables in V, such that all the constraints in C are satisfied.

The "support" of a constraint is defined to be the set of rv's upon which the constraint depends. The support of a set of constraints is simply the union of the supports of each member constraint of the set.

In finding values to satisfy a constraint, it can be useful to decompose the constraint into a set of smaller constraints. We shall refer to the set of smaller constraints as the "sub-constraints," and the constraint from which the sub-constraints are produced as the "parent constraint." A key feature of sub-constraints is that each depends on fewer variables than the parent constraint. In addition, it can be useful to find a decomposition wherein the support of each sub-constraint is disjoint from the support of any other sub-constraint.

In particular, when finding a solution to a set of constraints represented as BDDs, it is only necessary to conjoin the constraints if there is overlap between their sets of support variables. The size of a BDD representation of constraints can increase greatly as a result of a conjunction and, to conserve the computational resources necessary to solve a set of constraints, it can be desirable to reduce the amount of conjunction that needs to be done. Finding a decomposition of a set of constraints can increase the opportunities for dividing the constraints into independent sets, wherein the support of each independent set of constraints is disjoint from the support of any other independent set of constraints.

Two main types of constraint decomposition are addressed by the present invention, depending upon the type of Boolean connector operator that is introduced between the sub-constraints. The Boolean connector operator can be an AND operator or an OR operator. The two main types of decomposition addressed herein are: AND decomposition and OR decomposition. In AND decomposition, a constraint, or a set of constraints, is decomposed into a set of sub-constraints connected by the AND operator. In OR decomposition, a constraint, or a set of constraints, is decomposed into a set of sub-constraints connected by the OR operator.

In order to accomplish AND decomposition, the present invention relies upon a Theorem 1.

Theorem 1 provides a simple operation to test for, and create, a pair of sub-constraints G and H which are independent in any two variables $x_0$ and $x_1$. A successful application of Theorem 1 results in a G term that is not dependent upon an $x_1$ and an H term that is not dependent upon an $x_0$. The test operation itself, comprised of two existential quantification operations and a single AND (or intersection) of the results, can be efficiently implemented using BDDs.

While Theorem 1 produces a decomposition in which the resulting H term and G term each have at least one variable not shared by the other, Theorem 1 often needs to be applied repeatedly in order to produce an H term and G term with entirely disjoint supports.

This can be accomplished by recursively applying Theorem 1 to the G term, such that all the variables, except for the initial $x_0$ that was skipped, are existentially quantified out. A Lemma 3 is presented that permits this to be accomplished in a simplified way, by avoiding the generation of the subsequent H terms that would otherwise need to accompany each application of Theorem 1 to remove an additional rv from the G term.

Given the relationship of Theorem 1, which shows when and how two variables can be separated into disjoint sub-constraints, Section 3.1 provides a pseudo-code procedure, called "Decomp," for separating as many variables as possible, of an input constraint (or function), into disjoint sub-constraints. The parameter "F" for Decomp is the function to be decomposed (also referred to as factoring). Since the sv's of a constraint are typically a given, Decomp can be used just to separate the rv's of a constraint, or constraint set, into disjoint sub-constraints.

Decomp is comprised of two an outer loop and a nested inner loop. The outer loop iterates over the rv's in the support of "F." The outer loop is described in terms of an iteration variable "i," and the current rv iterated over is referred to as a "current rv at 'i.'" The inner loop also iterates over the rv's in the support of "F." The inner loop is described in terms of an iteration variable "j," and the current rv iterated over is referred to as a "current rv at 'j.'" There is a particular sequence in which the outer loop iterates over the rv's of "F." The inner loop follows the same sequence, except that the inner loop begins at one rv ahead of the current position of the outer loop in its sequence.

Each outer loop iteration of Decomp begins with a value for a variable called "Remain." From the "Remain" value, in accordance with Theorem 1, an "H" value is determined.

The inner loop successively removes variables, disjoint from the variable removed from "H," from the initial value of "Remain," in search of a "G" value that is supported by a minimal number of random variables. When the inner loop ends, a variable "Curr" will have been updated with the smallest value for "G," in terms of the number of variables in its support, that satisfies Theorem 1. Additional H terms do not need to be determined in the inner loop, while the G term is being successively narrowed, because of Lemma 3. The "H" of the current outer loop iteration becomes the "Remain" of the succeeding outer loop iteration.

A procedure called "Merge" is useful if the final result set of Decomp does not only contain functions whose support sets are disjoint from each other.

The parameters of Merge are "S," which is the set of sub-constraints (or G terms) found by Decomp, and "V," which is the set of all random variables in the original function "F" that was input to Decomp for decomposition. Merge begins by initializing a variable R to the value of S. The outer loop of Merge iterates over each rv of V, referred to by the variable "x." For each iteration, the outer loop collects the set of all members of R (or sub-constraints) that have the variable represented by "x" in their support. The sub-constraints identified are conjoined into a single new sub-constraint by the inner loop. The remaining sub-constraints of R, that do not use the rv currently represented by "x," are identified. R is then updated to be the set of sub-constraints comprising the sub-constraints not using "x" and the new conjoined sub-constraint.

An example detailed simulation of Merge, upon a "Result" set from Decomp, is shown in Section 4.2.

Decomp can be applied iteratively to decompose an input constraint set that may contain multiple constraints. For each constraint of an input constraint set, Decomp is applied and the results of each such Decomp application are unioned together.

If an OR decomposition into sub-constraints is desired, a corollary of Theorem 1, called Corollary 2, can be used.

Modifications of "Decomp" and "Merge," to perform OR decomposition, are presented.

In addition to decomposing constraints to provide greater opportunity to group constraints into sub-sets that each depend upon an independent set of rv's, decomposition can also be used to identify "hold constraints." Hold constraints are constraints that depend upon only one rv. Because they depend upon only one rv, hold constraints do not need to be conjoined with other constraints that depend upon multiple rv's, even if the constraints that are dependent upon multiple rv's (referred to herein as multiple-rv constraints) share the rv of the hold constraint. A process for solving hold constraints, independently of multiple-rv constraints, is presented.

While the invention is presented herein primarily with respect to constraints as applied to circuit verification, it is well known that constraint languages have many other applications.

BRIEF DESCRIPTION OF THE DRAWINGS

The accompanying drawings, that are incorporated in and constitute a part of this specification, illustrate several embodiments of the invention and, together with the description, serve to explain the principles of the invention.

DETAILED DESCRIPTION OF PREFERRED EMBODIMENTS

Reference will now be made in detail to preferred embodiments of the invention, examples of which are illustrated in the accompanying drawings. Wherever possible, the same reference numbers will be used throughout the drawings to refer to the same or like parts.

This specification contains pseudo-code to illustrate several embodiments of the invention and to explain its principles. The pseudo-code is loosely based upon the C and C++ programming languages. The C and C++ programming languages are described in such texts as "The C Programming Language", by B. W. Kernighan and D. M. Ritchie, Prentice Hall, Inc., 1988, ISBN 0-13-110362-8 (paperback), 0-13-110370-9 (hardback) and "The C++ Programming Language," by Bjarne Stroustrup, Addison-Wesley Pub. Co., 3rd edition, July 1997, ISBN 0-2018-8954-4, which are herein incorporated by reference. The pseudo-code combines the use of programming-language-like constructs with the utilization of mathematical set notation.

Table of Contents to Detailed Description

1. Problem Formulation
2. Constraint Solving
   2.1 Overview
   2.2 Constraint Decomposition Procedure -continued Table of Contents to Detailed Description 2.3 Corollary Constraint Decomposition Procedure
   2.4 Hold Constraints
   2.5 Other Applications
3. Pseudo-Code Listings
   3.1 Constraint Decomposition Procedure
   3.2 Merge Overlapping Procedure
4. Example Execution of Constraint Decomposition Procedure
   4.1 Example Execution of Decomp
   4.2 Example Execution of Merge
   4.3 Example Specific Execution of Decomp
5. Proofs
   5.1 Theorem 1
   5.2 Lemma 3
6. HARDWARE ENVIRONMENT

1. Problem Formulation

The present invention comprises techniques for solving combinational constraint expressions.

The combinational constraints solving problem can be formulated as follows. Consider a set of "m" variables, $V=\{v_1, v_2, \ldots, v_m\}$, and a set of "n" relations or constraints, $C=\{C_0, C_1, \ldots, C_n\}$, such that each constraint is a relation between expressions over a subset of the variables in V.

A constraint is any expression that evaluates to a Boolean value (i.e., either TRUE or FALSE). In this context, an expression is any legal sequence of variables and operators, as defined in the language used to express the constraints. Each variable in V has a range of values that can possibly be assigned to it.

A variable in V can be a random variable (rv) or a state variable (sv). The set of random variables (or rv's) in V can be referred to as r_collec and the set of state variables (or sv's) in V can be referred to as s_collec. A random variable can be defined as taking on, at the appropriate point in the execution of an HVL program, a value that is randomly selected from its range, such that all the active constraints that the variable participates in are satisfied. A state variable is similar to an "ordinary" programming language variable, i.e., it is a variable whose value is set by the various assignment constructs of the HVL. In addition to being a function of the HVL program itself, a state variable can also represent feedback from the DUV that is used by the HVL program to adapt the further course of testing. The constraint solving problem comprises finding legal assignments to all random variables in V, given the particular values currently assigned to the state variables in V, such that all the constraints in C are satisfied.

An application of this problem is in generating input stimuli for a random simulation, where the input stimuli must conform to a collection of constraints which model the legal environment of the design under verification. For a set of constraints C, we are repeatedly given values for s_collec and need to find values for r_collec such that all constraints of C evaluate to TRUE for the given s_collec and found r_collec. Further, r_collec should be found in a pseudo-random way that covers the space of all satisfying solutions.

The "support" of a constraint is defined to be the set of rv's upon which the constraint depends. The support of a set of constraints is simply the union of the supports of each member constraint of the set.

Consider the following constraint solving problem, labeled Example 1, that is written in the OpenVera High Level Verification Language (also referred to herein as "Vera"), a product of Synopsys, Inc., Mountain View, Calif., USA:

EXAMPLE 1

```
rand integer x0, x1, x2, x3;
constraint c1 {
0 == f(x0, x1, x2, x3);
}
```

In the OpenVera language, c1 represents a block of constraints, in this case containing only one constraint. Variables "x0," "x1," "x2," and "x3" are declared to be random variables of the integer data type. The constraint of block c1 is a declarative statement regarding a relationship that must be maintained between the random variables. The constraint states that random variables x0, x1, x2 and x3 are input to a function "f" whose output must be equal to zero. Rather than the right hand side of the constraint being an actual procedure call, to a procedure named "f," the function "f" is being used to represent any four-variable expression that is permissible in the constraint language (which, in this Example, is OpenVera). The constraint solving problem comprises finding values for x0, x1, x2 and x3 such that the declarative statement of block c1 is satisfied. Within an OpenVera program, since OpenVera is an object-oriented programming language, Example 1 is part of a class declaration from which instances are created. The constraint solving process can be invoked by applying a randomize method to an instance. If "f" is chosen to represent the expression x0+x1+x2+x3, one solution to the constraint of Example 1 is: x0=3, x1=2, x2=−4 and x3=−1.

Application of the present invention to the constraint of Example 1 is discussed below in connection with Section 4.1.

In finding values to satisfy a constraint, it can be useful to decompose the constraint into a set of smaller constraints. We shall refer to the set of smaller constraints as the "sub-constraints," and the constraint from which the sub-constraints are produced as the "parent constraint." A key feature of sub-constraints is that each depends on fewer variables than the parent constraint. In addition, it can be useful to find a decomposition wherein the support of each sub-constraint is disjoint from the support of any other sub-constraint.

In particular, when finding a solution to a set of constraints represented as BDDs, it is only necessary to conjoin the constraints if there is overlap between their sets of support variables. The size of a BDD representation of constraints can increase greatly as a result of a conjunction and, to conserve the computational resources necessary to solve a set of constraints, it can be desirable to reduce the amount of conjunction that needs to be done. Finding a decomposition of a set of constraints can increase the opportunities for dividing the constraints into independent sets, wherein the support of each independent set of constraints is disjoint from the support of any other independent set of constraints. An example of a constraint solving procedure that can benefit from a decomposition procedure is presented in the '0504 Application.

Two main types of constraint decomposition are addressed by the present invention, depending upon the type of Boolean connector operator that is introduced between the sub-constraints. The Boolean connector operator can be an AND operator or an OR operator. The two main types of decomposition addressed herein are: AND decomposition and OR decomposition. In AND decomposition, a constraint, or a set of constraints, is decomposed into a set of sub-constraints connected by the AND operator. In OR decomposition, a constraint, or a set of constraints, is decomposed into a set of sub-constraints connected by the OR operator.

2. Constraint Solving 2.1 Overview

In order to accomplish AND decomposition, the present invention relies upon the following theorem:

Theorem 1: Given a function $$F(X) | X = (x_0, x_1, \ldots x_n)$$

There exist two functions $G(x_0, x_2, \ldots x_n)$ and $H(x_1, x_2, \ldots x_n)$ such that $$F(x_0, x_1, \ldots x_n) = G(x_0, x_2, \ldots x_n) \cdot H(x_1, x_2, \ldots x_n) \quad \text{(Equation 1)}$$

if and only if:

$$F(x_0, x_1, \ldots x_n) = \exists x_1, F(x_0, x_2, x_3, \ldots x_n) \cdot \exists x_0, F(x_1, x_2, \ldots, x_n) \quad \text{(Equation 2)}$$

The proof for Theorem 1 is given in Section 5.1.

The result of Theorem 1 provides a simple operation to test for, and create, a pair of sub-constraints G and H which are independent in any two variables $x_0$ and $x_1$. The test operation itself (Equation 2), comprised of two existential quantification operations and a single AND (or intersection) of the results, can be efficiently implemented using BDDs. Such BDD implementation can be accomplished with BDD manipulation packages, such as the CUDD BDD Package. CUDD is described in such documents as:

[1] F. Somenzi. "CUDD: CU Decision Diagram Package Release 2.3.1, 2001." Boulder, Colo.: University of Colorado Boulder.

The above reference [1] for CUDD is herein incorporated by reference.

While Theorem 1 produces a decomposition in which the resulting H term and G term each have at least one variable not shared by the other, Theorem 1 often needs to be applied repeatedly in order to produce an H term and G term with entirely disjoint supports.

This can be accomplished by recursively applying Theorem 1 to the G term, such that all the variables, except for the initial $x_0$ that was skipped, are existentially quantified out. Symbolically, such recursive application of Theorem 1 to the G term can be represented as follows:

$$F = H_{0-0} \cdot G_{1-1}$$
$$F = H_{0-0} \cdot (H_{0-1} \cdot G_{1-2})$$
$$F = H_{0-0} \cdot (H_{0-1} \cdot (H_{0-2} \cdot G_{1-3}))$$
$$F = H_{0-0} \cdot (H_{0-1} \cdot (H_{0-2} \cdot (H_{0-3} \cdot G_{1-4})))$$

$$\ldots$$

$$F = H_{0-0} \cdot (H_{0-1} \cdot (H_{0-2} \cdot (H_{0-3} \cdot \ldots (H_{0-(n-1)} \cdot G_{1-n}) \ldots)))$$
$$= H_{0-0} \cdot H_{0-1} \cdot H_{0-2} \cdot H_{0-3} \cdot \ldots H_{0-(n-1)} \cdot G_{1-n}$$
$$= H_{0-0} \cdot G_{1-n} \quad \text{(by Lemma 3)}$$

The x-y subscripts shown above represent the range of variables that have been existentially quantified from the term. For the first application of Theorem 1, since only $x_0$ has been existentially quantified from H, and only $x_1$ has been existentially quantified from G, the two terms have the subscripted ranges of, respectively, 0-0 and 1-1.

Theorem 1 is then recursively applied to $G_{1-1}$ with the objective of the resulting $G_{1-2}$ having an additional variable existentially quantified from it. Such recursive application continues until the range of variables from $x_1$ to $x_n$ have all been existentially quantified from the resulting $G_{1-n}$. Thus $G_{1-n}$ is dependent only on $x_0$, while all the H terms that were found, in the course of arriving at $G_{1-n}$, are dependent upon variables other than $x_0$ and are therefore all have independent support sets.

Note that since the determination of $G_{1-n}$ began with determining $H_{0-0}$, and $H_{0-0}$ is independent of $G_{1-n}$, it would be desirable if the determination of all the other H terms, namely terms $H_{0-1}$, to $H_{0-(n-1)}$, could be avoided.

Lemma 3, whose proof is presented in Section 5.2, permits exactly this simplification to be accomplished.

2.2 Constraint Decomposition Procedure

Given the relationship of Theorem 1, which shows when and how two variables can be separated into disjoint sub-constraints, Section 3.1 provides a pseudo-code procedure, called "Decomp," for separating as many variables as possible, of an input constraint (or function), into disjoint sub-constraints. The pseudo-code of Section 3.1 is depicted graphically in FIG. 3. The parameter "F" for Decomp is the function to be decomposed (also referred to as factoring). Since the sv's of a constraint are typically a given, Decomp can be used just to separate the rv's of a constraint, or constraint set, into disjoint sub-constraints.

Section 4.1 presents a detailed step-by-step simulation of Decomp upon the function f(x0, x1, x2, x3) of Example 1. Since each application of existential quantification produces a new (albeit related) function, a new function name is introduced in Section 4.1 after each existential quantification. For example, for step i=0, the H produced, resulting from existential quantification of x0 from "f," is referred to by the new function name "f1." FIG. 1 presents a similar step-by-step simulation to that shown in Section 4.1, but in a graphical form.

Figure 3:
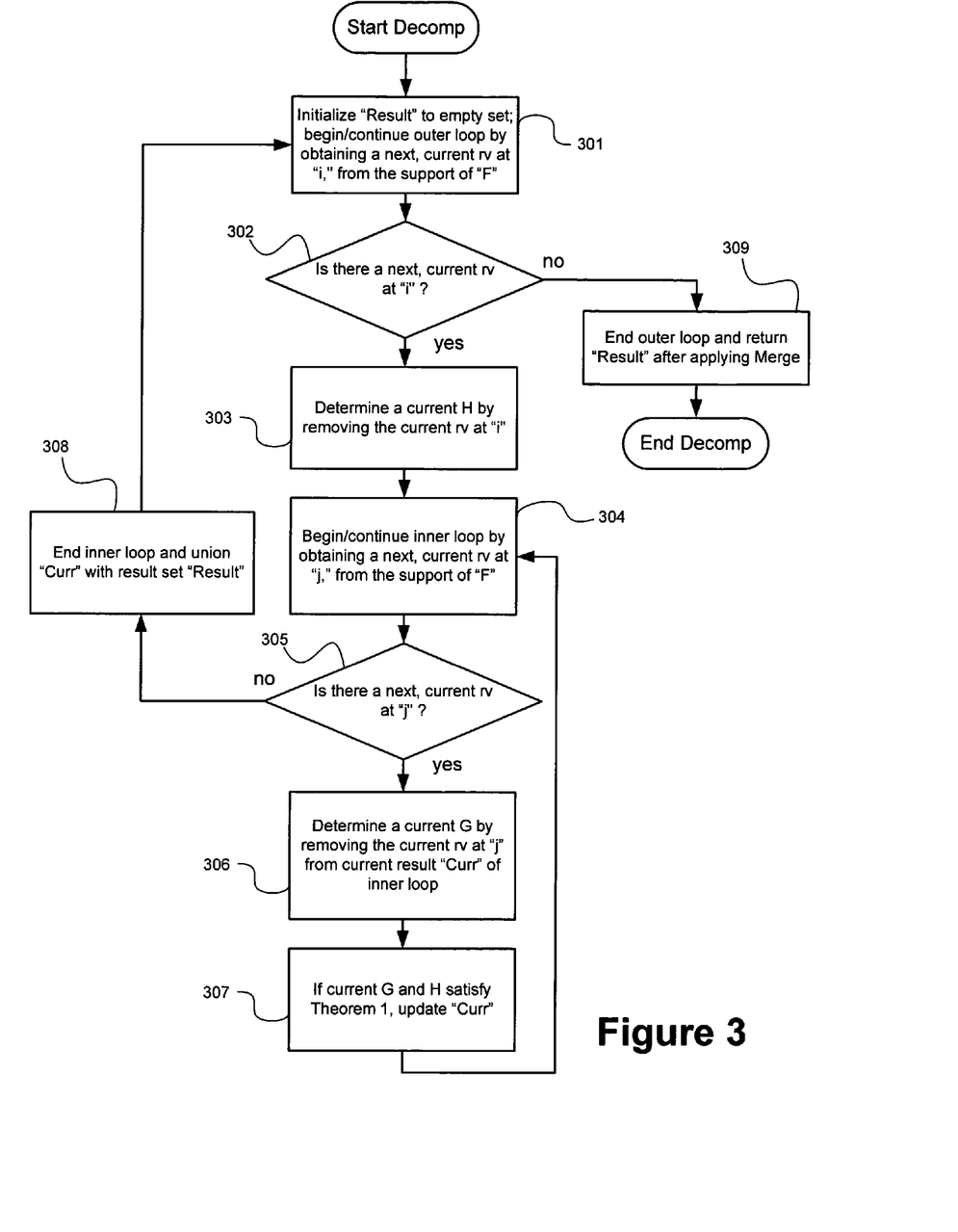
FIG. 3 graphically depicts the Decomp pseudo-code of Section 3.1.

As can be seen in Section 3.1, Decomp is comprised of two nested loops: an outer loop (steps 301–308 of FIG. 3) that begins on line 1.b and iterates over variable "i," and an inner loop (steps 304–307 of FIG. 3) that begins on line 1.b.iii and iterates over the variable "j." In FIG. 3, the outer loop begins in step 301 by initializing a "Result" variable to the empty set (line 1.a of Section 3.1) and then obtaining a next rv, in the support of "F." Such next rv is referred to as a "current rv at 'i.'" The inner loop begins in FIG. 3 at step 304 by obtaining a next rv, in the support of "F." Such next rv is referred to as a "current rv at 'j,'" where: j=i+1. Regarding the pseudo-code of Section 3.1, the variable "n" represents the number of variables in the function of parameter "F" minus one. For Example 1, "n" is three. FIG. 1 is divided into four parts, 1A–1D, to reflect each outer loop iteration of variable "i" being set to a value from zero to three. Within each of FIGS. 1A–1D, the inner loop iterations, over variable "j," are shown below the dashed line labeled "Inner Loop."

Each outer loop iteration of Decomp begins with a value for "Remain." From the "Remain" value, in accordance with Theorem 1, an "H" value is determined (see line 1.b.i of Section 3.1, and step 303 of FIG. 3) by existentially removing an additional variable.

The procedure "ExisQuant," used in Section 3.1, existentially quantifies the variable of its first parameter from the function of its second parameter and returns the result. The procedure "Union," used in Section 3.1, unions its parameters and returns the result.

The inner loop successively removes variables, disjoint from the variable removed from "H," from the initial value of "Remain," in search of a "G" value that is supported by a minimal number of random variables (see line 1.b.iii.1 of Section 3.1 and step 306 of FIG. 3). While in progress in the inner loop, the current smallest value for "G" is kept in "Curr." Each potential new value for "G," which is dependent upon fewer variables than any current value for "G" as stored in "Curr," is tested in accordance with Equation 2 of Theorem 1 (see line 1.b.iii.2 of the pseudo-code of Section 3.1, and step 307 of FIG. 3). If the intersection of the potential "G" value, with the "H" value, equals the "Remain," then the "Curr" value is updated. In this way, when the inner loop ends, "Curr" will have been updated with the smallest value for "G," in terms of the number of variables in its support, that satisfies Theorem 1. Note that additional H terms do not need to be determined in the inner loop, while the G term is being successively narrowed, because of Lemma 3.

The "H" of the current outer loop iteration becomes the "Remain" of the succeeding outer loop iteration (see line 1.b.v of Section 3.1). The "H" of the next-to-last outer loop iteration becomes the "G" of the last outer loop iteration, with the "H" of the last outer loop iteration being a function dependent upon zero random variables (rv's), although it may still be dependent upon state variables (sv's). Thus, if the original "F" passed to Decomp is satisfiable for the given current state of the sv's, the "H" of the last outer loop iteration (included in the "Result" by the union of line 1.d of Section 3.1) is simply a value of TRUE. Symbolically, the operation of the outer loop iterations can be represented as follows:

$$G_0 \cdot H_0$$

$$G_0 \cdot (G_1 \cdot H_1)$$

$$G_0 \cdot (G_1 \cdot (G_2 \cdot H_2))$$

$$G_0 \cdot (G_1 \cdot (G_2 \cdot (G_{n-2} \cdot (G_{n-1} \cdot H_{n-1}))))$$

$$G_0 \cdot (G_1 \cdot (G_2 \ldots \cdot (G_{n-2} \cdot (G_{n-1} \cdot (G_n \cdot H_n)))))$$

Where:

$$G_n = H_{n-1}$$

$$H_n = F(\ ) = TRUE$$

Each line of the above represents the result of a successive single outer loop iteration, with each subscript being a single integer that indicates the iteration of the outer cycle in which the symbolically represented function is produced. As can be seen, the first outer loop iteration produces a $G_0$ and an $H_0$. In the second outer loop iteration, the $H_0$ is replaced by the expression $(G_1 \cdot H_1)$. In general, an $H_i$ from an outer loop iteration "i" is replaced by a nested expression $(G_{i+1} \cdot H_{i+1})$ in the succeeding outer loop iteration. For the nested expression produced by the next-to-last outer loop iteration, $(G_{n-1} \cdot H_{n-1})$, the $H_{n-1}$ term becomes the $G_n$ term in the last outer loop iteration, while the term $H_n$ of the last outer loop iteration is a function dependent upon no random variables and is therefore the value TRUE (if the original "F" passed to Decomp is satisfiable for the given current state of the sv's).

With respect to Example 1, the simulation of Section 4.1 assumes that the final "Result" set, from applying Decomp to a function "f" (where "f" in OpenVera would be an expression), is: f4(x0), f7(x1), f9(x2), f8(x3). The conjunction of all four functions of the Result set is therefore equal to the original function f(x0,x1,x2,x3). Since the original function f(x0,x1,x2,x3) has been divided into four smaller functions, each dependent upon a single unique random variable, the finding of a combination to satisfy f(x0,x1,x2,x3) has been reduced to finding, individually, a setting for each of functions f4, f7, f9 and f8.

In order to illustrate the merging procedure of Section 3.2, called "Merge," that is useful if the final "Result" set does not only contain functions whose support sets are disjoint from each other, an alternative solution will now be assumed as the final "Result" set of Section 4.1: f4(x0,x2), f7(x1), f9(x2,x3), f8(x3). In this case, the support of f4 overlaps with the support of f9, because of the common x2, and the support of f9 overlaps with the support of f8, because of the common x3. Since a goal of constraint decomposition is to identify a set of sub-constraints each with a minimal support set, but still having such support sets be independent from each other, a recombination of the functions with overlapping support sets may need to be accomplished. The end result of applying the merging procedure to the alternative solution results in the following two functions: f4(x0,x2)·f9(x2,x3)·f8(x3), f7(x1).

The parameters of Merge are "S," which is the set of sub-constraints (or G terms) found by Decomp, and "V," which is the set of all random variables in the original function "F" that was input to Decomp for decomposition. Merge begins (see line 1.a of the pseudo-code of Section 3.2) by initializing a variable R to the value of S. The outer loop of Merge iterates (see line 1.b of Section 3.2) over each rv of V, referred to by the variable "x," and collects in Subconstraints_Using_x the set of all members of R that have the variable represented by "x" in their support. All the sub-constraints in Subconstraints_Using_x are conjoined into a single new sub-constraint by the inner loop of Merge (see line 1.b.iii of Section 3.2) to produce the value for New_Combined_Subconstraint.

The remaining sub-constraints of R, that do not use the rv currently represented by "x," are stored in Subconstraints_Not_Using_x (see line 1.b.iv of Section 3.2). R is then updated to be the set of sub-constraints comprising the union of the sub-constraints not using "x" and the new conjoined sub-constraint (see line 1.b.v of Section 3.2).

Finally, the value of R is returned (see line 1.d of Section 3.2) as pointing to the set of independent sub-constraints into which F was decomposed.

An example detailed simulation of Merge, upon the alternative "Result" set discussed above, is shown in Section 4.2.

View 1 of Section 4.2 is just after R has been initialized to the set of sub-constraints found by Decomp.

Views 2–5 of Section 4.2 each depict the state of the following variables after each iteration of the outer loop of Merge: Subconstraints_Using_x, New_Combined_Subconstraint, Subconstraints_Not_Using_x and R. Views 2–5 are iterating over the variables of V in the following order: x0, x1, x2, x3.

Figure 4:
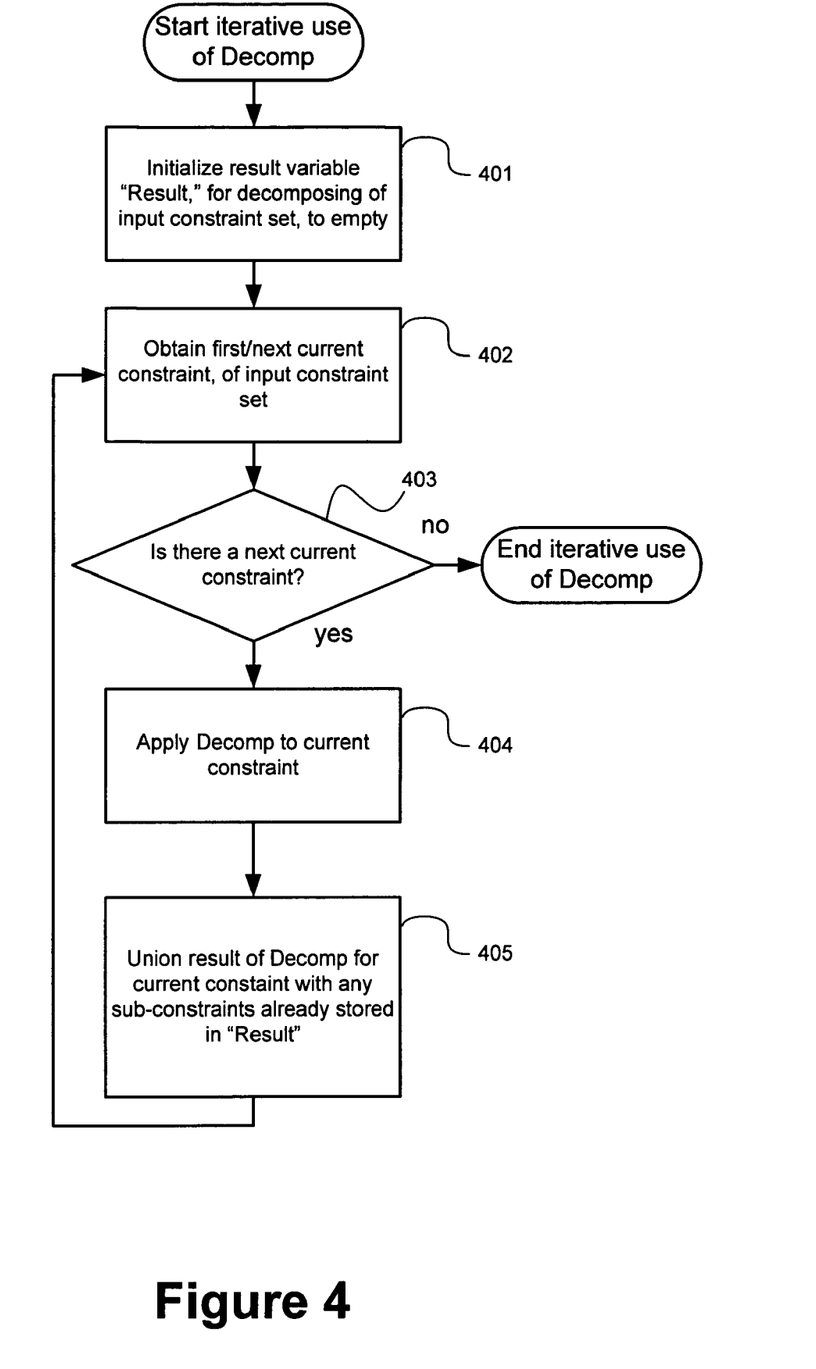
FIG. 4 depicts iterative application of Decomp to decompose an input constraint set.

FIG. 4 depicts iterative application of Decomp to decompose an input constraint set that may contain multiple constraints. For each constraint of an input constraint set, the procedure of FIG. 4 applies Decomp and the results of each such Decomp application are unioned together. Specifically, the procedure of FIG. 4 begins by initializing a "Result" variable, different from the "Result" variable used internally to Decomp, to the empty set. Step 401. The procedure then obtains the first or next constraint, referred to as the "current constraint," that is a member of the input constraint set. Step 402. If there is a first or next current constraint to be decomposed, the "yes" path of step 403 is taken and Decomp is applied (step 404) to the current constraint. The set of sub-constraints, returned by the application of Decomp in step 404, is unioned with the current contents of "Result" in step 405.

Section 4.3 depicts an application of the decomposition procedure of the present invention to a specific example constraint. For purposes of illustration, Section 4.3 presents the functions determined as Boolean equations, rather than as BDDs.

In the case of Section 4.3, two 3-bit buses, called A and B, can take random values but are constrained to be equal to each other. To follow the variable notation of the Decomp pseudo-code, the initial function F is mapped into variables x0 to x5. A partition, in which each variable of F is put into a separate block, is selected.

As can be seen, the function input to Decomp is the single conjunctive term (x0x1+−x0−x1)·(x2x3+−x2−x3)·(x4x5+−x4−x5), while the result returned is the following set: {(x0x1+−x0−x1), (x2x3+−x2−x3), (x4x5+−x4−x5)}. As illustrated in the '0504 Application, this decomposition can be useful in the constraint solving processing by reducing the size of the maximum BDD representation needed.

While the result of Decomp shown in Section 4.3 also includes the terms (x1+−x1), (x3+−x3), and (x5+−x5), such terms, which are irrelevant to whether the set of constraints can be solved since they are tautological, are easily identified and eliminated.

2.3 Corollary Constraint Decomposition Procedure

If an OR decomposition into sub-constraints is desired, the following corollary of Theorem 1, called Corollary 2, can be used:

Corollary 2: Given a function $F(X)|X=(x_0, x_1, \ldots x_n)$

There exist two functions $G(x_0, x_2, \ldots x_n)$ and $H(x_1, x_2, \ldots x_n)$ such that $F(x_0, x_1, \ldots x_n) = G(x_0, x_2, \ldots x_n) + H(x_1, x_2, \ldots x_n)$ (Equation 3)

if and only if:

$F(x_0, x_1, \ldots x_n) = \forall x_1, F(x_0, x_2, x_3, \ldots x_n)) + \forall x_0,$
$F(x_1, x_2, \ldots x_n))$ (Equation 4)

"Decomp" of Section 3.1 can be modified, as follows, to perform OR decomposition. The existential quantification functions of lines 1.b.i and 1.b.iii.1 are changed to universal quantification. The AND (also called intersection) operation of line 1.b.iii.2 is changed to OR (also called union).

"Merge" of Section 3.2 can be modified, as follows, to perform OR decomposition. The AND (i.e., "·") operator of line 1.b.iii.1 is changed to an OR (i.e., "+") operator. It is preferable to change the name of the variable "r_for_ANDing" to "r_for_ORing."

2.4 Hold Constraints

In addition to decomposing constraints to provide greater opportunity to group constraints into sub-sets that each depend upon an independent set of rv's, decomposition can also be used to identify "hold constraints."

Hold constraints are constraints that depend upon only one rv. Because they depend upon only one rv, hold constraints do not need to be conjoined with other constraints that depend upon multiple rv's, even if the constraints that are dependent upon multiple rv's (referred to herein as multiple-rv constraints) share the rv of the hold constraint. A process for solving hold constraints, independently of multiple-rv constraints, is as follows.

All the hold constraints, that have been identified in a set of constraints, are grouped together and solved before any of the multiple-rv constraints are solved. Once a hold constraint has been solved, there are two possibilities for its rv. First, a hold constraint may not constrain its rv to be of any particular value. In this case, if the rv of the hold constraint also appears in a multiple-rv constraint, the multiple-rv constraint is solved without regard to the hold constraint. Second, a hold constraint may constrain its rv to be of a particular value, either one or zero. In this case, if the rv of the hold constraint also appears in a multiple-rv constraint, the multiple-rv constraint is solved with the value determined to be required by the hold constraint.

Note that in the example execution of Merge of Section 4.2, the functions f8(x3) and f7(x1) are hold constraints. Therefore, rather than producing the set {f8(x3)·f4(x0,x2)·f9(x2,x3), f7(x1)}, the hold constraints can be put into a separate set {f8(x3), f7(x1)} that is solved before the expressions of the set {f4(x0,x2)·f9(x2,x3)}.

2.5 Other Applications

While the invention is presented herein primarily with respect to constraints as applied to circuit verification, it is well known that constraint languages have many other applications. For example, constraint languages can be used to express circuit designs for purposes of synthesis. Furthermore, constraints can be used in programming languages (e.g., C++ or Java) primarily intended for the creation or verification of software, in addition to their use in programming languages (e.g., OpenVera of Synopsys, Inc.) primarily intended for the specification or verification of circuit designs.

3. Pseudo-Cod Listings 3.1 Constraint Decomposition Procedure

```
1. Decomp(F) {
    a. Remain = F; Result = { };
    b. For (i = 0 . . . n) {
        i. H = ExisQuant(x_i, Remain);
        ii. Curr = Remain;
        iii. For (j = i+1 . . . n) {
            1. G = ExisQuant(x_j, Curr);
            2. If (Remain = G · H) { Curr = G };
        iv. }
        v. Remain = H; Result = Union(Result, Curr);
    c. }
    d. Result = Union(Result, H)
    e. return Merge(Result);
2. }
```

3.2 Merge Overlapping Procedure

```
1. Merge(S,V) {
    a. R ⇐ S;
    b. For (x ∈ V) {
        i. New_Combined_Subconstraint = TRUE;
        ii. Subconstraints_Using_x = (r: r ∈ R ∧ x ∈ Support( r ) );
        iii. For (r_for_ANDing ∈ Subconstraints_Using_x )
            1. New_Combined_Subconstraint =
                New_Combined_Subconstraint · r_for_ANDing ;
        iv. Subconstraints_Not_Using_x = (r: r ∈ R ∧ x ∈ Support( r ) );
        v. R ⇐ New_Combined_Subconstraint ∪ Subconstraints_Not_Using_x;
    c. }
    d. Return R;
2. }
```

4. Example Execution of Constraint Decomposition Procedure 4.1 Example Execution of Decomp

```
Remain = f(x0,x1,x2,x3)
Result = {}
For i = 0
    H = f1(x1,x2,x3)
    Curr = f(x0,x1,x2,x3)
    For j = 1
        G = f2(x0,x2,x3)
        If (f(x0,x1,x2,x3) = f2(x0,x2,x3) and f1(x1,x2,x3))
            Curr = f2(x0,x2,x3)
    For j = 2
        G = f3(x0,x3)
        If (f(x0,x1,x2,x3) = f3(x0,x3) and f1(x1,x2,x3))
            Curr = f3(x0,x3)
    For j = 3
        G = f4(x0)
        If (f(x0,x1,x2,x3) = f4(x0) and f1(x1,x2,x3))
            Curr = f4(x0)
    Remain = f1(x1,x2,x3)
    Result = { } union f4(x0)
For i = 1
    H = f5(x2,x3)
    Curr = f1(x1,x2,x3)
    For j = 2
        G = f6(x1,x3)
        If (f(x0,x1,x2,x3) = f6(x1,x3) and f5(x2,x3))
            Curr = f6(x1,x3)
    For j = 3
        G = f7(x1)
        If (f(x0,x1,x2,x3) = f7(x1) and f5(x2,x3))
            Curr = f7(x1)
    Remain = f5(x2,x3)
    Result = { f4(x0) } union f7(x1)
For i = 2
    H = f8(x3)
    Curr = f5(x2,x3)
    For j = 3
        G = f9(x2)
        If (f(x0,x1,x2,x3) = f9(x2) and f8(x3))
            Curr = f9(x2)
    Remain = f8(x3)
    Result = { f4(x0), f7(x1) } union f9(x2)
For i = 3
    H = f10( )
    Curr = f8(x3)
    Remain = f10( )
    Result = { f4(x0), f7(x1), f9(x2) } union f8(x3)
    Result = { f4(x0), f7(x1), f9(x2), f8(x3) } union f10( )
```

4.2 Example Execution of Merge

View 1:

R{f4(x0,x2), f7(x1), f9(x2,x3), f8(x3)}

View 2:

Subconstraints_Using_x={f4(x0,x2)}

New_Combined_Subconstraint=f4(x0,x2)

Subconstraints_Not_Usingx={f7(x1), f9(x2,x3), f8(x3)}

R={f4(x0,x2), f7(x1), f9(x2,x3), f8(x3)}

View 3:
  Subconstraints_Using_x={f7(x1)}
  New_Combined_Subconstraint=f7(x1)
  Subconstraints_Not_Using_x={f4(x0,x2), f9(x2,x3), f8(x3)}
  R={f4(x0,x2), f7(x1), f9(x2,x3), f8(x3)}
View 4:
  Subconstraints_Using_x={f4(x0,x2), f9(x2,x3)}
  New_Combined_Subconstraint=f4(x0,x2)·f9(x2,x3)
  Subconstraints_Not_Using_x={f7(x1), f8(x3)}
  R={f4(x0,x2) f9(x2,x3), f7(x1), f8(x3)}
View 5:
  Subconstraints_Using_x={f8(x3)}
  New_Combined_Subconstraint=f8(x3) f4(x0,x2) f9(x2, x3)
  Subconstraints_Not_Using_x={f4(x0,x2) f9(x2,x3), f7(x1)}
  R={f8(x3) f4(x0,x2)·f9(x2,x3), f7(x1)}

4.3 Example Specific Execution of Decomp

Notation used for this example: a minus sign, preceeding a variable name, represents a NOT sign (e.g., –x0 is the NOT of x0); two variables in immediate succession are conjoined (e.g., –x0–x1 is the AND of –x0 and –x1).

Start with a constraint that two 3-bit buses, called A and B, must be equal.

This can be represented by the following function:
F (a0,b0,a1,b1,a2,b2)=(a0b0+–a0–b0)·(a1b1+–a1–b1)·(a2b2+–a2–b2)

To follow variable notation of pseudo-code, map the variables of F as follows:

$$F(a0, b0, a1, b1, a2, b2) = F(x0, x1, x2, x3, x4, x5)$$
$$= (x0x1 + -x0 - x1) \cdot$$
$$(x2x3 + -x2 - x3) \cdot$$
$$(x4x5 + -x4 - x5)$$

Blocks selected:
$R^0$={x0}
$R^1$={x1}
$R^2$={x2}
$R^3$={x3}
$R^4$={x4}
$R^5$={x5}

The following is a detailed simulation of Decomp on F. Note that each subscript x-y indicates a range of random variables that have been existentially quantified from the expression represented by the symbol being subscripted.

For i=0:
Outer loop:
Remain=(x0x1+–x0–x1)·(x2x3+–x2–x3)·(x4x5+–x4–x5)
$H_{0-0}$=(x1+–x1)·(x2x3+–x2–x3)·(x4x5+–x4–x5)
  Inner loop:
  $G_{1-1}$=(x0+–x0)·(x2x3+–x2–x3)·(x4x5+–x4–x5)
  $G_{2-2}$=(x0x1+–x0–x1)·(x3+–x3)·(x4x5+–x4–x5)
  Curr=$G_{2-2}$
  $G_{2-3}$=(x0x1+–x0–x1)·(1)·(x4x5+–x4–x5)
  Curr=$G_{2-3}$
  $G_{2-4}$=(x0x1+–x0–x1)·(1)·(x5+–x5)
  Curr=$G_{2-4}$
  $G_{2-5}$=(x0x1+–x0–x1 )·(1)·(1)
  Curr=$G_{2-5}$
Outer loop (cont.):
Result={(x0x1+–x0–x1 )}
For i=1:
Outer loop:
Remain=(x1+–x1)·(x2x3+–x2–x3)·(x4x5+–x4–x5)
$H_{0-1}$=(1)·(x2x3+–x2–x3)·(x4x5+–x4–x5)
  Inner loop:
  $G_{2-2}$=(x1+–x1)·(x3+–x3)·(x4x5+–x4–x5)
  Curr=$G_{2-2}$
  $G_{2-3}$=(x1+–x1)·(1)·(x4x5+–x4–x5)
  Curr=$G_{2-3}$
  $G_{2-4}$=(x1+–x1)·(1)·(x5+–x5)
  Curr=$G_{2-4}$
  $G_{2-5}$=(x1+–x1)·(1)·(1)
  Curr=$G_{2-5}$
Outer loop (cont.):
Result={(x0x1+–x0–x1), (x1+–x1 )}
For i=2:
Outer loop:
Remain=(x2x3+–x2–x3)·(x4x5+–x4–x5)
Curr=Remain
$H_{0-2}$=(x3+–x3)·(x4x5+–x4–x5)
  Inner loop:
  $G_{3-3}$=(x2+–x2)·(x4x5+–x4–x5)
  $G_{4-4}$=(x2x3+–x2–x3)·(x5+–x5)
  Curr=G4-4
  $G_{4-5}$=(x2x3+–x2–x3)·(1)
Outer loop (cont.):
Result={(x0x1+–x0–x1), (x1+–x1), (x2x3+–x2–x3)}
For i=3:
Outer loop:
Remain=(x3+–x3)·(x4x5+–x4–x5)
Curr=Remain
$H_{0-3}$=(1)·(x4x5+–x4–x5)
  Inner loop:
  $G_{4-4}$=(x3+–x3)·(x5+–x5)
  Curr=G4-4
  $G_{4-5}$=(x3+–x3)·(1)
  Curr=$G_{4-5}$
Outer loop (cont.):
Result={(x0x1+–x0–x1), (x1+–x1), (x2x3+–x2–x3), (x3+–x3)}
For i=4:
Outer loop:
Remain=(x4x5+–x4–x5)
Curr=Remain
$H_{0-4}$=(x5+–x5)
  Inner loop:
  $G_{5-5}$=(x4+–x4)
Outer loop (cont.):
Result={(x0x1+–x0–x1), (x1+–x1), (x2x3+–x2–x3), (x3+–x3), (x4x5+–x4–x5)}
For i=5:
Outer loop:
Remain=(x5+–x5)
Curr=Remain
$H_{0-5}$=(1)
Result={(x0x1+–x0–x1), (x1+–x1), (x2x3+–x2–x3), (x3+–x3), (x4x5+–x4–x5), (x5+–x5)}
Result={(x0x1+–x0–x1), (x1+–x1), (x2x3+–x2–x3), (x3+–x3), (x4x5+–x4–x5), (x5+–x5), (1)}

5. Proofs

5.1 Theorem 1

Theorem 1: Given a function $$F(X)|X=(x_0, x_1, \ldots x_n)$$

There exist two functions $G(x_0, x_2, \ldots x_n)$ and $H(x_1, x_2, \ldots x_n)$ such that $$F(x_0, x_1, \ldots x_n) = G(x_0, x_2, \ldots x_n) \cdot H(x_1, x_2, \ldots x_n) \quad \text{(Equation 1)}$$

if and only if:

$$F(x_0, x_1, \ldots x_n) = \exists x_1, F(x_0, x_2, x_3, \ldots x_n) \cdot \exists x_0, F(x_1, x_2, \ldots x_n) \quad \text{(Equation 2)}$$

Proof of "if":

Assume Equation 2 is true and define the following correspondences:

$$G(x_0, x_2, \ldots x_n) = \exists x_1, F(x_0, x_2, x_3, \ldots x_n)$$

$$H(x_1, x_2, \ldots x_n) = \exists x_0, F(x_1, x_2, \ldots x_n)$$

Proof of "only if" by Contradiction:

(In the following proof by contradiction, please note that where an F, G or H has an "x" subscript, it represents the function that is being subscripted when the variable "x" is set to either TRUE or FALSE. For example, $F_{x_0}$ represents the function "F" when the variable $x_0$ is set to TRUE, while $G_{\overline{x_0}}$ represents the function "G" when the variable $x_0$ is set to FALSE.)

Assume Equation 2 is false, but that there exists a pair of functions G and H such that Equation 1 is true. Thus $F(X) = G(X) \cdot H(X)$. For simplicity, leave out the (X) argument for each function and expand Equation 2 to:

$$F \neq \exists x_1, F \cdot \exists x_0, F$$
$$\neq (F_{x_1} + F_{\overline{x_1}}) \cdot (F_{x_0} + F_{\overline{x_0}})$$
$$\neq F_{x_0} F_{x_1} + F_{x_0} F_{\overline{x_1}} + F_{\overline{x_0}} F_{x_1} + F_{\overline{x_0}} F_{\overline{x_1}}$$

Substituting $F = G \cdot H$:

$$G \cdot H \neq G_{x_0} H_{x_0} G_{x_1} H_{x_1} + G_{\overline{x_0}} H_{\overline{x_0}} G_{x_1} H_{x_1} + G_{x_0} H_{x_0} G_{\overline{x_1}} H_{\overline{x_1}} + G_{\overline{x_0}} H_{\overline{x_0}} G_{\overline{x_1}} H_{\overline{x_1}}$$

Because H does not depend on $x_0$, $H_{x_0} = H_{\overline{x_0}} = H$. Similarly, we have $G_{x_1} = G_{\overline{x_1}} = G$.

We then simplify by:

$$G \cdot H \neq H\, H_{x_1} G\, G_{x_0} + H\, H_{\overline{x_1}} G\, G_{x_0} + H\, H_{x_1} G\, G_{\overline{x_0}} + H\, H_{\overline{x_1}} G\, G_{\overline{x_0}}$$
$$\neq G \cdot H \cdot (H_{x_1} G_{x_0} + H_{\overline{x_1}} G_{x_0} + H_{x_1} G_{\overline{x_0}} + H_{\overline{x_1}} G_{\overline{x_0}})$$
$$\neq G \cdot H \cdot (H_{x_1} \cdot (G_{x_0} + G_{\overline{x_0}}) + H_{\overline{x_1}} \cdot (G_{x_0} + G_{\overline{x_0}}))$$
$$\neq G \cdot H \cdot (H_{x_1} + H_{\overline{x_1}})$$
$$\neq G \cdot H$$

Contradicting our initial assumption.

5.2 Lemma 3

$$F = H_{0\text{-}0} \cdot H_{0\text{-}1} \cdot H_{0\text{-}2} \cdot H_{0\text{-}3} \cdot \ldots H_{0\text{-}(n-1)} \cdot G_{1\text{-}n} = H_{0\text{-}0} \cdot G_{1\text{-}n}$$

Where: the subscript x-y of a term indicates the range of variables existentially quantified from it.

Proof by Induction:

$F = H_{0\text{-}0} \cdot G_{1\text{-}1}$ (by Theorem 1)

Each $H_{0\text{-}(n+1)}$ is an existential quantification of one additional variable from $H_{0\text{-}n}$. Therefore, $H_{0\text{-}n} \Rightarrow H_{0\text{-}(n+1)}$ Assuming the lemma is true for "n," we have $H_{0\text{-}(n-1)} \cdot G_{1\text{-}n} = F$. Replacing $G_{1\text{-}n}$ with $H_{0\text{-}(n)} \cdot G_{1\text{-}(n+1)}$ yields: $H_{0\text{-}(n-1)} \cdot H_{0\text{-}(n)} \cdot G_{1\text{-}(n+1)} = F$ Because $H_{0\text{-}(n-1)} \Rightarrow H_{0\text{-}(n)}$, we reduce $H_{0\text{-}(n-1)} \cdot H_{0\text{-}(n)} \cdot G_{1\text{-}(n+1)} = F$ to: $H_{0\text{-}(n-1)} \cdot G_{1\text{-}(n+1)} = F$

6. Hardware Environment

Figure 5:
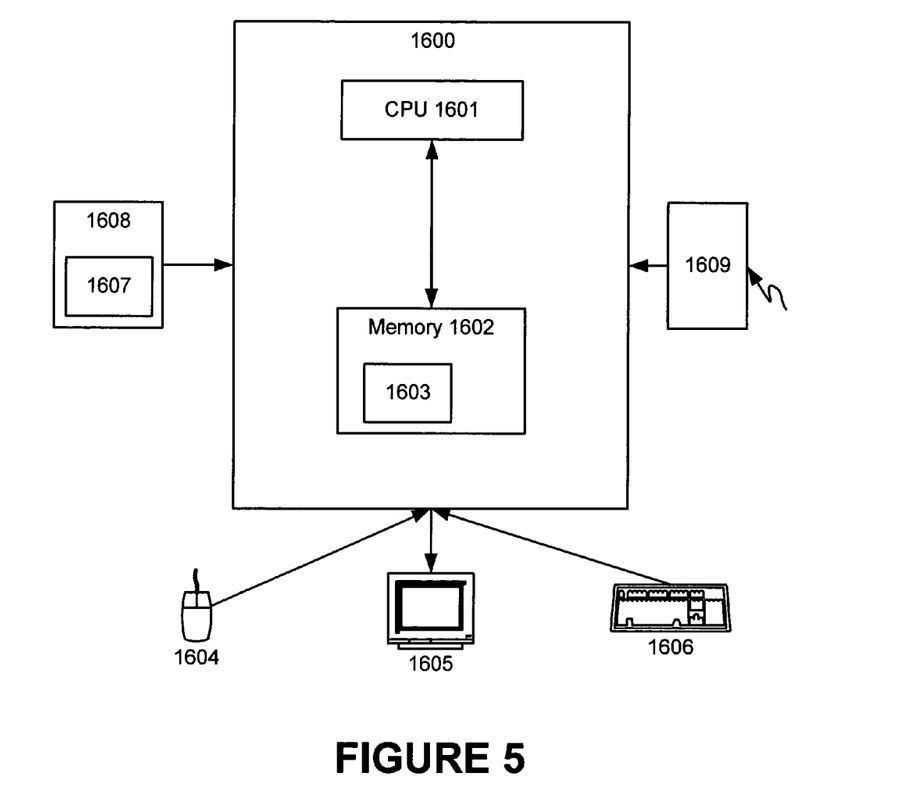
FIG. 5 shows a computing hardware environment within which to operate the present invention.

The constraint set solving architecture of the present invention can be executed within a computing environment (or data processing system) such as that of FIG. 5. FIG. 5 depicts a workstation computer 1600 comprising a Central Processing Unit (CPU) 1601 (or other appropriate processor or processors) and a memory 1602. Memory 1602 has a portion of its memory in which is stored the software tools (or computer programs) and data of the present invention. While memory 1603 is depicted as a single region, those of ordinary skill in the art will appreciate that, in fact, such software may be distributed over several memory regions or several computers. Furthermore, depending upon the computer's memory organization (such as virtual memory), memory 1602 may comprise several types of memory (including cache, random access memory, hard disk and networked file server). Computer 1600 can be equipped with a display monitor 1605, a mouse pointing device 1604 and a keyboard 1606 to provide interactivity between the software of the present invention and the chip designer. Computer 1600 also includes a way of reading computer readable instructions from a computer readable medium 1607, via a medium reader 1608, into the memory 1602. Computer 1600 also includes a way of reading computer readable instructions via the Internet (or other network) through network interface 1609.

In one embodiment, the processes for solving constraints can be implemented using software produced by Synopsys, Inc., of Mountain View, Calif., USA. Examples of such Synopsys software are: OpenVera High Level Verification Language (including its associated electronic design automation software) and Magellan RTL Formal Verification. In some embodiments, computer programs embodying the present invention are stored in a computer readable medium, e.g. CD-ROM or DVD. In other embodiments, the computer programs are embodied in an electromagnetic carrier wave. For example, the electromagnetic carrier wave may include the programs being accessed over a network.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. An electromagnetic waveform comprising a computer program, the computer program for functional verification of a representation of an electronic design of an integrated circuit (IC), the computer program comprising the following steps when executed by a data processing system:
   producing an H term by quantification of a first variable from a constraint;
   producing a G term by quantification of a second variable, different than the first variable, from the constraint;

returning the H term and the G term as a decomposition of the constraint if a result of a Boolean connective operator, applied to the H term and the G term, is functionally equivalent to the constraint; and generating input stimuli for a simulation of the representation of the electronic design, where the input stimuli must conform to the constraint.

2. A method for functional verification of a representation of an electronic design of an integrated circuit, comprising:

producing an H term by quantification of a first variable from a constraint;

producing a G term by quantification of a second variable, different than the first variable, from the constraint;

returning the H term and the G term as a decomposition of the constraint if a result of a Boolean connective operator, applied to the H term and the G term, is functionally equivalent to the constraint; and generating input stimuli for a simulation of the representation of the electronic design, where the input stimuli must conform to the constraint.

3. A method for functional verification of a representation of an electronic design of an integrated circuit, comprising:

producing an H term by quantification of a first variable from a constraint;

producing a G term by successively quantifying an additional variable from the constraint, different than the first variable, each time a result of a Boolean connective operator, applied to the H term and the successively quantified G term, is functionally equivalent to the constraint; and generating input stimuli for a simulation of the representation of the electronic design, where the input stimuli must conform to the constraint.

4. The method of claim 3, further comprising:

recursively repeating the steps of producing an H term and producing a G term, with the H term taking a place of the constraint in the recursion; and ending the recursion when the H term produced is a function of no variables.

5. The method of claim 4, further comprising:

returning, as a decomposition of the constraint, a set containing each G term produced prior to a subsequent recursion.

6. The method of claim 5, further comprising:

merging overlapping factors, in the set containing each G term produced prior to a subsequent recursion, prior to returning the set as a decomposition of the constraint.

7. The method of claim 2, wherein the decomposition is an AND decomposition, the quantification is existential quantification and the Boolean connective operator is an AND operator.

8. The method of claim 2, wherein the decomposition is an OR decomposition, the quantification is universal quantification and the Boolean connective operator is an OR operator.

9. The method of claim 3, wherein the decomposition is an AND decomposition, the quantification is existential quantification and the Boolean connective operator is an AND operator.

10. The method of claim 3, wherein the decomposition is an OR decomposition, the quantification is universal quantification and the Boolean connective operator is an OR operator.

11. A computer program product comprising:

a computer usable medium having computer readable code embodied therein for functional verification of a representation of an electronic design of an integrated circuit, the computer program product including:

computer readable program code devices configured to cause a computer to effect producing an H term by quantification of a first variable from a constraint;

computer readable program code devices configured to cause a computer to effect producing a G term by quantification of a second variable, different than the first variable, from the constraint;

computer readable program code devices configured to cause a computer to effect returning the H term and the G term as a decomposition of the constraint if a result of a Boolean connective operator, applied to the H term and the G term, is functionally equivalent to the constraint; and computer readable program code devices configured to cause a computer to effect generating input stimuli for a simulation of the representation of the electronic design, where the input stimuli must conform to the constraint.

12. A computer program product comprising:

a computer usable medium having computer readable code embodied therein for functional verification of a representation of an electronic design of an integrated circuit, the computer program product including:

computer readable program code devices configured to cause a computer to effect producing an H term by quantification of a first variable from a constraint;

computer readable program code devices configured to cause a computer to effect producing a G term by successively quantifying an additional variable from the constraint, different than the first variable, each time a result of a Boolean connective operator, applied to the H term and the successively quantified G term, is functionally equivalent to the constraint; and computer readable program code devices configured to cause a computer to effect generating input stimuli for a simulation of the representation of the electronic design, where the input stimuli must conform to at least the constraint.

13. An electromagnetic waveform comprising a computer program, the computer program for functional verification of a reDresentation of an electronic design of an integrated circuit, the computer program comprising the following steps when executed by a data processing system:

producing an H term by quantification of a first variable from a constraint;

producing a G term by successively quantifying an additional variable from the constraint, different than the first variable, each time a result of a Boolean connective operator, applied to the H term and the successively quantified G term, is functionally equivalent to the constraint; and generating input stimuli for a simulation of the representation of the electronic design, where the input stimuli must conform to the constraint.

* * * * *

UNITED STATES PATENT AND TRADEMARK OFFICE
CERTIFICATE OF CORRECTION

PATENT NO. : 7,107,553 B2 Page 1 of 1
APPLICATION NO. : 10/642885
DATED : September 12, 2006
INVENTOR(S) : Brian Eugene Lockyear It is certified that error appears in the above-identified patent and that said Letters Patent is hereby corrected as shown below:

In claim 13 (at column 20, line 47), please delete the word, "reDresentation" and replace with the word --representation--.

Signed and Sealed this

Fifteenth Day of May, 2007

JON W. DUDAS
*Director of the United States Patent and Trademark Office*